(12) United States Patent
Choi

(10) Patent No.: US 8,742,445 B2
(45) Date of Patent: *Jun. 3, 2014

(54) LIGHT EMITTING DEVICE AND LIGHT UNIT

(71) Applicant: LG Innotek Co., Ltd., Seoul (KR)

(72) Inventor: Woon Kyung Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/662,047

(22) Filed: Oct. 26, 2012

(65) Prior Publication Data

US 2013/0049056 A1 Feb. 28, 2013

Related U.S. Application Data

(63) Continuation of application No. 13/174,068, filed on Jun. 30, 2011, now Pat. No. 8,319,251.

(30) Foreign Application Priority Data

Jul. 1, 2010 (KR) .................. 10-2010-0063636

(51) Int. Cl.
*H01L 33/36* (2010.01)
*H01L 33/58* (2010.01)

(52) U.S. Cl.
USPC .. 257/98; 257/99; 257/E33.062; 257/E33.067

(58) Field of Classification Search
USPC .................. 257/98, 99, E33.062, E33.067
See application file for complete search history.

(56) References Cited

U.S. PATENT DOCUMENTS

| 8,421,112 B2 * | 4/2013 | Jeong et al. ............. 257/99 |
| 2006/0157718 A1 | 7/2006 | Seo et al. |
| 2010/0019264 A1 | 1/2010 | Jeong |
| 2010/0096652 A1 | 4/2010 | Choi et al. |
| 2011/0001145 A1 | 1/2011 | Park |
| 2012/0018764 A1 | 1/2012 | Choi et al. |
| 2014/0008688 A1 | 1/2014 | Shimokawa et al. |

FOREIGN PATENT DOCUMENTS

| EP | 2 194 586 A1 | 6/2010 |
| WO | WO 2009/084860 A2 | 7/2009 |

* cited by examiner

*Primary Examiner* — Julio J Maldonado
*Assistant Examiner* — Whitney T Moore
(74) *Attorney, Agent, or Firm* — Birch, Stewart, Kolasch & Birch, LLP

(57) ABSTRACT

Provided are a light emitting device and a light unit. The light emitting device includes a light emitting structure layer comprising a first conductive type semiconductor layer, an active layer under the first conductive type semiconductor layer, and a second conductive type semiconductor layer under the active layer; a first conductive layer having a first portion disposed under the second conductive type semiconductor layer and a second portion electrically connected to the first conductive type semiconductor layer; a second conductive layer under the second conductive type semiconductor layer and electrically connected to the second conductive type semiconductor layer; an insulation layer between the first conductive layer and the second conductive layer; and a tunnel barrier between the first portion of the first conductive layer and the second conductive layer.

20 Claims, 16 Drawing Sheets

LIGHT EMITTING DEVICE AND LIGHT UNIT

This application is a continuation of co-pending application Ser. No. 13/174,068, filed on Jun. 30, 2011, which claims priority under 35 U.S.C. 119 to Korean Patent Application No. 10-2010-0063636 filed on Jul. 1, 2010. The entire contents of all of the above applications are hereby incorporated by reference.

BACKGROUND

Embodiments relates to a light emitting device, a method of fabricating the light emitting device, and a light unit.

Group III-V nitride semiconductors are spotlighted as core materials of light emitting diodes (LEDs) or laser diodes (LDs) due to their physical and chemical characteristics.

Such a light emitting device converts electrical signals into light such as infrared rays or visible rays using characteristics of compound semiconductors. In recent, as light efficiency of the light emitting device is increased, the light emitting device is being used in various fields such as display devices and lighting devices.

SUMMARY

Embodiments provide a light emitting device having a new structure, a method of fabricating the light emitting device, and a light unit.

Embodiments also provide a light emitting device in which a light emitting structure layer is protected from an electrostatic discharge (ESD), a method of fabricating the light emitting device, and a light unit.

In one embodiment, a light emitting device comprises: a light emitting structure layer comprising a first conductive type semiconductor layer, an active layer under the first conductive type semiconductor layer, and a second conductive type semiconductor layer under the active layer; a first conductive layer having a first portion disposed under the second conductive type semiconductor layer and a second portion electrically connected to the first conductive type semiconductor layer; a second conductive layer under the second conductive type semiconductor layer and electrically connected to the second conductive type semiconductor layer; an insulation layer between the first conductive layer and the second conductive layer; and a tunnel barrier between the first portion of the first conductive layer and the second conductive layer.

In another embodiment, a light unit comprises: a board; a light emitting device on the board; and an optical member through which light provide from the light emitting device is transmitted, wherein the light emitting device comprises: a light emitting structure layer comprising a first conductive type semiconductor layer, an active layer under the first conductive type semiconductor layer, and a second conductive type semiconductor layer under the active layer; a first conductive layer having a first portion disposed under the second conductive type semiconductor layer and a second portion electrically connected to the first conductive type semiconductor layer; a second conductive layer under the second conductive type semiconductor layer and electrically connected to the second conductive type semiconductor layer; an insulation layer between the first conductive layer and the second conductive layer; and a tunnel barrier between the first portion of the first conductive layer and the second conductive layer.

The details of one or more embodiments are set forth in the accompanying drawings and the description below. Other features will be apparent from the description and drawings, and from the claims.

DETAILED DESCRIPTION OF THE EMBODIMENTS

Figure 1:
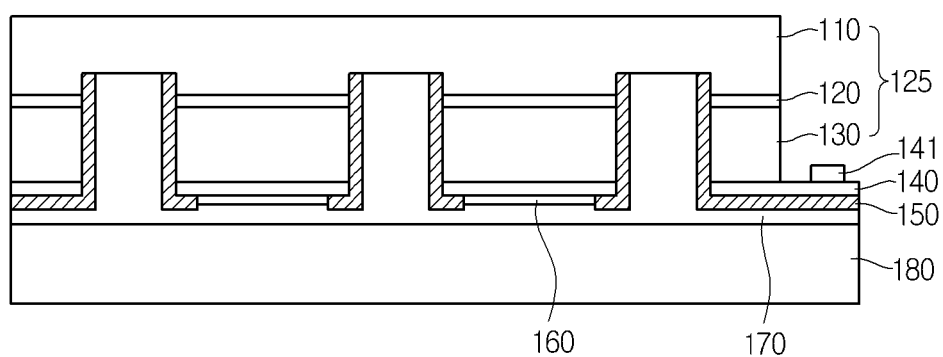
FIG. 1 is a sectional view of a light emitting device according to an embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, embodiments will be described with reference to the accompanying drawings.

FIG. 1 is a sectional view of a light emitting device 100 according to an embodiment.

Referring to FIG. 1, the light emitting device according to an embodiment may comprise a light emitting structure layer 125, a first conductive layer 170, a second conductive layer 140, an insulation layer 150, a tunnel barrier 160, a conductive support substrate 180, and an electrode 141.

The light emitting structure layer 125 may comprise a first conductive type semiconductor layer 110, an active layer 120 under the first conductive type semiconductor layer 110, and a second conductive type semiconductor layer 130 under the active layer 120.

Electrons and holes supplied from the first and second conductive type semiconductor layers 110 and 130 are recombined with each other in the active layer 120 to generate light. Here, the electrons or holes may be supplied from the first conductive type semiconductor layer 110, and also, the holes or electrons may be supplied from the second conductive type semiconductor layer 130.

The first conductive type semiconductor layer 110 may be formed of a group III-V compound semiconductor in which a first conductive type dopant is doped, e.g., a semiconductor material having a compositional formula of $In_xAl_yGa_{1-x-y}N$ ($0 \leq x \leq 1$, $0 \leq y \leq 1$, $0 \leq x+y \leq 1$). For example, the first conductive type semiconductor layer 110 may be formed of one of GaN, AlN, AlGaN, InGaN, InN, InAlGaN, AlInN, AlGaAs, GaP, GaAs, GaAsP, and AlGaInP. When the first conductive type semiconductor layer 110 is an N-type semiconductor layer, the first conductive type dopant may comprise an N-type dopant such as Si, Ge, Sn, Se, and Te. The first conductive type semiconductor layer 110 may have a single or multi layered structure, but is not limited thereto.

The active layer 120 may be disposed under the first conductive type semiconductor layer 110. Also, the active layer 120 may have one of a single quantum well structure, a multi quantum well (MQW) structure, a quantum dot structure, and a quantum wire structure. The active layer 120 may have a cycle of a well layer and a barrier layer using the group III-V compound semiconductor material. For example, the active layer 120 may have a cycle of an InGaN well layer/GaN barrier layer or a cycle of an InGaN well layer/AlGaN barrier layer.

When the active layer 120 has the quantum well structure, the active layer 120 may have a single or multi quantum well structure comprising a well layer having a compositional formula of $In_xAl_yGa_{1-x-y}N$ ($0 \leq x \leq 1$, $0 \leq y \leq 1$, $0 \leq x+y \leq 1$) and a barrier layer having a compositional formula of $In_xAl_yGa_{1-x-y}N$ ($0 \leq x \leq 1$, $0 \leq y \leq 1$, $0 \leq x+y \leq 1$). The well layer may be formed of a material having an energy band gap less than that of the barrier layer.

The second conductive type semiconductor layer 130 may be disposed under the active layer 120. Also, the second conductive type semiconductor layer may be formed of a group III-V compound semiconductor in which a second conductive type dopant is doped, e.g., a semiconductor material having a compositional formula of $In_xAl_yGa_{1-x-y}N$ ($0 \leq x \leq 1$, $0 \leq y \leq 1$, $0 \leq x+y1$). For example, the second conductive type semiconductor layer 130 may be formed of one of GaN, AlN, AlGaN, InGaN, InN, InAlGaN, AlInN, AlGaAs, GaP, GaAs, GaAsP, and AlGaInP. When the second conductive type semiconductor layer 130 is a P-type semiconductor layer, the second conductive type dopant may include a P-type dopant such as Mg and Zn.

The light emitting structure layer 125 may further comprise a semiconductor layer having a polarity opposite to that of the second conductive type semiconductor layer 130 under the second conductive type semiconductor layer 130. Also, the first conductive type semiconductor layer 110 may be a P-type semiconductor layer, and the second conductive type semiconductor layer 130 may be an N-type semiconductor layer. Thus, the light emitting structure layer 125 may have at least one of an N-P junction structure, a P-N junction structure, an N-P-N junction structure, and a P-N-P junction structure.

The first conductive layer 170 may be disposed under the second conductive type semiconductor layer 130. A portion of the first conductive layer 170 may be disposed in a recess passing through the active layer 120 and the second conductive type semiconductor layer 130 and electrically connected to the first conductive type semiconductor layer. The recess may be called a via. The first conductive layer 170 may contact the first conductive type semiconductor layer 110.

The first conductive layer 170 may be formed of at least one of Al, Ti, Cr, Cu, Au, Sn, and Ca.

Also, the first conductive layer 170 may have a multi layered structure. For example, a first layer constituting an upper region of the first conductive layer 170 may be formed of a material for ohmic-contacting the first conductive type semiconductor layer 110 and thus electrically connected to the first conductive type semiconductor layer 110. A third layer constituting a lower region of the first conductive layer 170 may be formed of a material having a superior adhesion force to easily adhere to an external electrode. A second layer between the first layer and the third layer may be formed of at least one of a diffusion barrier metal material such as Ni for preventing interlayer diffusion and a metal material such as Cu having superior conductivity.

The second conductive layer 140 may be disposed under the second conductive type semiconductor layer 130. The second conductive layer 140 may be electrically connected to the second conductive type semiconductor layer 130.

The insulation layer 150 may be disposed between the first conductive layer 170 and the second conductive layer 140. The insulation layer 150 may be disposed in the recess which passes through a portion of the second conductive type semiconductor layer 130 and a portion of the active layer 120. The insulation layer 150 may be disposed between the first conductive layer 170 and the second conductive type semiconductor layer 130. Also, the insulation layer 150 may be disposed between the first conductive layer 170 and the active layer 120.

The tunnel barrier 160 may be disposed between the first conductive layer 170 and the second conductive layer 140. The tunnel barrier 160 may be disposed under the second conductive type semiconductor layer 130.

The conductive support substrate 180 may be disposed under the first conductive layer 170. The electrode 141 may be electrically connected to the second conductive layer 140. The electrode 141 may be disposed on the second conductive layer 140.

The light emitting structure layer 125 may comprise a recess in which portions of the regions of the active layer 120 and the second conductive type semiconductor layer 130 are etched to expose the first conductive type semiconductor layer 110. Also, the recess may be formed by etching portions of the regions of the second conductive type semiconductor layer 130, the active layer 120, the first conductive type semiconductor layer 110. The first conductive layer 170 may contact the first conductive type semiconductor layer 130 through the recess. A method of fabricating the recess will be described below in detail.

Although a side surface of the recess in the light emitting structure layer 125 is vertically provided in FIG. 1, the recess may have a width gradually increasing or decreasing from the second conductive type semiconductor layer 130 toward the first conductive type semiconductor layer 110, i.e., a width having a trapezoid shape. For example, the recess may be formed so that a portion at which the first conductive type semiconductor layer 110 is disposed has a width less than that of a portion at which the second conductive type semiconductor layer 130 is disposed.

The first conductive layer 170 and the insulation layer 150 may be disposed in the recess.

The second conductive layer 140 may be disposed under the second conductive type semiconductor layer 130. The second conductive layer 140 may be disposed between the second conductive type semiconductor layer 130 and the tunnel barrier 160. That is, the second conductive layer 140 may be electrically connected to the second conductive type semiconductor layer 130. Also, the second conductive layer 140 together with the first conductive layer 170 may provide a power into the light emitting structure layer 125. For example, the second conductive layer 140 may directly contact the second conductive type semiconductor layer 130.

For example, the second conductive layer 140 may have a single or multi layered structure and be formed of at least one of Cu, Ag, Al, Ni, Ti, Cr, Pd, Au, and Sn, but is not limited thereto.

The first conductive layer 170 may be disposed under the most region of a bottom surface of the light emitting structure layer 125 according to an embodiment.

In the light emitting device 100 according to an embodiment, the first and second conductive layers 170 and 140 for supplying a power into the light emitting structure layer 125 are disposed on the bottom or side surface of the light emitting structure layer 125. Thus, light extracted into a top surface direction of the light emitting device 100 may not be absorbed by the first and second conductive layers 170 and 140. Accordingly, light extraction efficiency according to an embodiment can be increased.

The first and second conductive layers 170 and 140 may be disposed under the light emitting structure layer 125 according to an embodiment. Heat generated in the light emitting structure layer 125 may be effectively dissipated through the first and second conductive layers 170 and 140 to the outside.

The first and second conductive layers 170 and 140 may support the light emitting structure layer 125.

The first conductive layer 170 may be disposed to pass through the active layer 120 and the second conductive type semiconductor layer 130. An upper region of the first conductive layer 170 may contact the first conductive type semiconductor layer 110, and thus be electrically connected to the first conductive type semiconductor layer 110. The insulation layer 150 for preventing the light emitting structure layer 125 from being electrically short-circuited therein may be disposed on a side surface of the first conductive layer 170.

The insulation layer 150 may be disposed between a side surface of the first conductive layer 170 and the light emitting structure layer 125. Also, the insulation layer 150 may be disposed between the first conductive layer 170 and the second conductive layer 140.

The insulation layer 150 may be formed of a light-transmitting and insulating material. The insulation layer 150 may be realized using oxide or nitride. For example, the insulation layer 150 may be formed of at least one of $SiO_2$, $SiO_x$, $SiO_xN_y$, $Si_3N_4$, $Al_2O_3$, and $TiO_x$, but is not limited thereto.

The insulation layer 150 for preventing the light emitting structure layer 125 from being electrically short-circuited therein may be disposed on a side surface of the first conductive layer 170. Also, the insulation layer 150 may be disposed at a portion of a region defined under the second conductive layer 140.

The tunnel barrier 160 may be disposed in a lower region of the second conductive layer 140 on which the insulation layer 150 is not disposed. The tunnel barrier 160 may be formed of the same material as that of the insulation layer 150 or a material different from that of the insulation layer 150. The tunnel barrier 160 may have a thickness less than that of the insulation layer 150. For example, the tunnel barrier 160 may have a thickness of about 1 nm to about 20 nm.

The tunnel barrier 160 may be formed of a dielectric compound comprising at least one of materials comprising oxide, nitride, and fluoride. For example, the tunnel barrier 160 may be formed of at least one of $SiO_2$, $Si_xN_y$, $TiO_2$, $MgF_2$, and $Al_2O_3$, and have a single or multi layered structure.

When the tunnel barrier 160 has a thickness less than that of the insulation layer 150, thermal dissipation efficiency may be improved. Accordingly, reliability of the device can be improved. For example, the tunnel barrier 160 may be disposed on an area of about 80% to about 90% of that of the second conductive type 140.

The tunnel barrier 160 may be disposed between the first conductive layer 170 and the second conductive layer 140 to constitute the light emitting structure layer 125 and a parallel circuit.

A withstanding voltage characteristic of the light emitting device 100 may be improved by the tunnel barrier 160. For example, when an overcurrent is significantly applied into the first and second conductive layers 170 and 140, the overcurrent may be bypassed through the tunnel barrier 160 to prevent the light emitting structure layer 125 from being damaged. Accordingly, the light emitting device 100 having the improved withstanding voltage characteristic can be provided.

The electrode 141 may be formed of at least one material of Ti, Al, In, Ta, Pd, Co, Ni, Si, Ge, Ag, Au, Hf, Pt, Ru, and Au or alloys thereof and have a single or multi layer structure. The electrode 141 may be disposed on the second conductive layer 140 to supply a power into the second conductive type semiconductor layer 130.

The conductive support substrate 180 may support the light emitting structure layer 125 and be electrically connected to the first conductive layer 170 to supply a power into the first conductive type semiconductor layer 110. The conductive support substrate 180 may be formed of titanium (Ti), chrome (Cr), nickel (Ni), aluminum (Al), platinum (Pt), gold (Au), tungsten (W), copper (Cu), molybdenum (Mo), copper-tungsten (Cu—W), and a carrier wafer (e.g., Si, Ge, GaN, GaAs, ZnO, SiC, SiGe) that is a semiconductor substrate in which impurities are injected.

The conductive support substrate 180 may have a thickness varied according to a design of the light emitting device 100. For example, the conductive support substrate 180 may have a thickness of about 50 μm to about 300 μm. It is unnecessary to provide the conductive support substrate 180. When the first conductive layer 170 has a sufficiently thick thickness, the conductive support substrate 180 may be omitted.

As described above, the light emitting device 100 according to an embodiment may comprise the tunnel barrier 160 connected to the light emitting structure layer 125 in parallel to prevent the light emitting structure layer 125 from being damaged by a high voltage.

Hereinafter, a method of fabricating the light emitting device according to an embodiment will be described in detail. However, duplicate descriptions, which have been described already in the previous exemplary embodiments, will be omitted or described briefly.

FIGS. 2 to 9 are views illustrating a process of fabricating the light emitting device 100 according to an embodiment.

Figure 2:
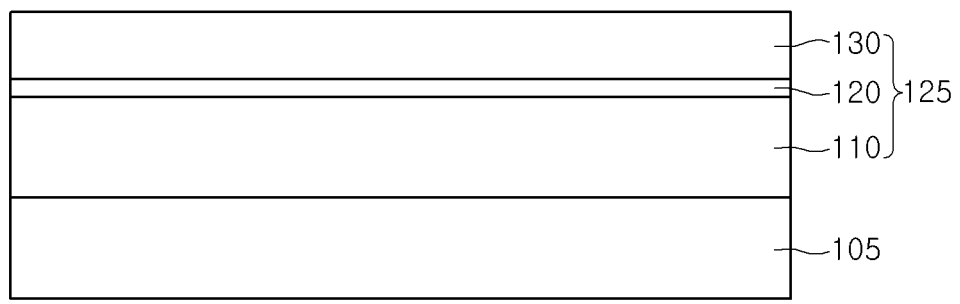
FIGS. 2 to 9 are views illustrating a process of fabricating the light emitting device according to an embodiment.

Referring to FIG. 2, a light emitting structure layer 125 may be formed on a growth substrate 105.

The growth substrate 105 may be formed of at least one of sapphire (Al2O3), SiC, GaN, Si, ZnO, AlN, GaAs, β-Ga2O3, GaP, InP, Ge, but is not limited thereto.

The light emitting structure layer 105 formed on the growth substrate 105 may comprise a first conductive type semiconductor layer 110, an active layer 120, and a second conductive type semiconductor layer 130. The active layer 120 is disposed between the first conductive type semiconductor layer 110 and the second conductive type semiconductor layer 130.

The light emitting structure layer 125 may be formed using a method such as metal organic chemical vapor deposition (MOCVD), chemical vapor deposition (CVD), plasma-enhanced chemical vapor deposition (PECVD), molecular beam epitaxy (MBE), and hydride vapor phase epitaxy (HYPE), but is not limited thereto.

A buffer layer and an undoped semiconductor layer may be further formed between the growth substrate 105 and the first conductive type semiconductor layer 110 to reduce differences in lattice constants and thermal expansion coefficients therebetween and to improve crystalline of the light emitting structure layer 125.

The first conductive type semiconductor layer 110 may be formed of a group III-V compound semiconductor in which a first conductive type dopant is doped, e.g., one of GaN, AlN, AlGaN, InGaN, InN, InAlGaN, AlInN, AlGaAs, GaP, GaAs, GaAsP, and AlGaInP. When the first conductive type semiconductor layer 110 is an N-type semiconductor layer, the first conductive type dopant may include N-type dopants such as Si, Ge, Sn, Se, and Te. The first conductive type semiconductor layer 110 may be formed in a single or multi layer, but is not limited thereto.

The active layer 120 may be formed on the first semiconductor layer 110. The active layer 120 may have one of a single quantum well structure, a multi quantum well (MQW) structure, a quantum dot structure, and a quantum wire structure, but is not limited thereto. For example, when the active layer 120 has the MQW structure, the active layer 120 may have a cycle of a well layer and a barrier layer, e.g., an InGaN well layer/GaN barrier layer or a cycle of an InGaN well layer/AlGaN barrier layer using the group III-V compound semiconductor material. The well layer may be formed of a material having a band gap less than that of the barrier layer.

A conductive type clad layer may be formed above or/and under the active layer 120. The conductive type clad layer may be formed of an AlGaN-based semiconductor and may have a band gap greater than that of the active layer 120.

The second conductive type semiconductor layer 130 may be formed on the active layer 120. The second conductive type semiconductor layer 130 may be realized by a P-type semiconductor layer in which a P-type dopant is doped. The second conductive type semiconductor layer 130 may be formed of a group III-V compound semiconductor in which a second conductive type dopant is doped, e.g., one of GaN, AlN, AlGaN, InGaN, InN, InAlGaN, AlInN, AlGaAs, GaP, GaAs, GaAsP, and AlGaInP. When the second conductive type semiconductor layer 130 is the P-type semiconductor layer, the second conductive type dopant may comprise P-type dopants such as Mg, Zn, Ca, Sr, and Ba. The second conductive type semiconductor layer 130 may have a single or multi layered structure, but is not limited thereto.

The light emitting structure layer 125 may further comprise an N-type semiconductor layer under the second conductive type semiconductor layer 130. Also, the first conductive type semiconductor layer 110 may be a P-type semiconductor layer, and the second conductive type semiconductor layer 130 may be an N-type semiconductor layer. Thus, the light emitting structure layer 125 may have at least one of an N-P junction structure, a P-N junction structure, an N-P-N junction structure, and a P-N-P junction structure.

In the current embodiment, although the light emitting structure layer 125 comprising the N-type nitride semiconductor layer containing the N-type dopant, the active layer disposed under the N-type nitride semiconductor layer, and the P-type nitride semiconductor layer containing the P-type dopant is mainly described, the present disclosure is not limited thereto. Also, the light emitting structure layer 125 may have a stacked structure and material, which are variously varied.

Figure 3:
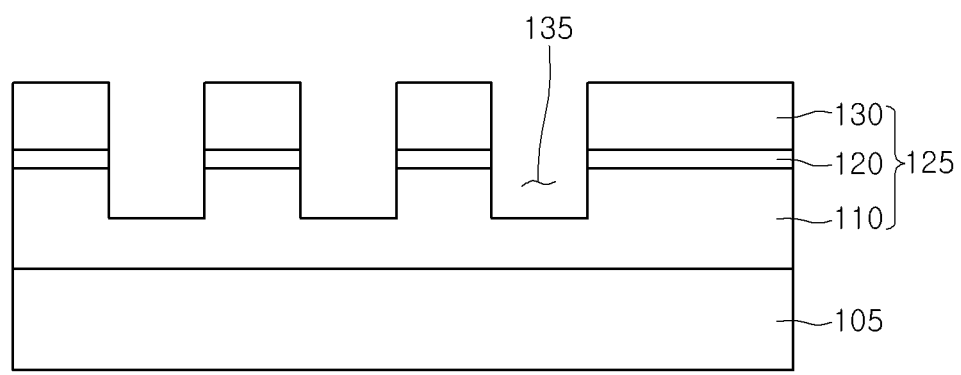

Referring to FIG. 3, the light emitting structure layer 125 may be selectively removed to form at least one recess 135 so that a portion of the first conductive type semiconductor layer 110 is exposed.

The recess 135 may be formed by an etching process comprising a wet etching process and a dry etching process or a laser process, but is not limited thereto. The light emitting structure layer 125 in which the etching process or the laser process is performed to form the recess 135 may have a side surface perpendicular or inclined with respect to a bottom surface of the recess 135. The recess 135 may be perpendicular or inclined with respect to a bottom surface of the light emitting structure layer 125.

Figure 4:
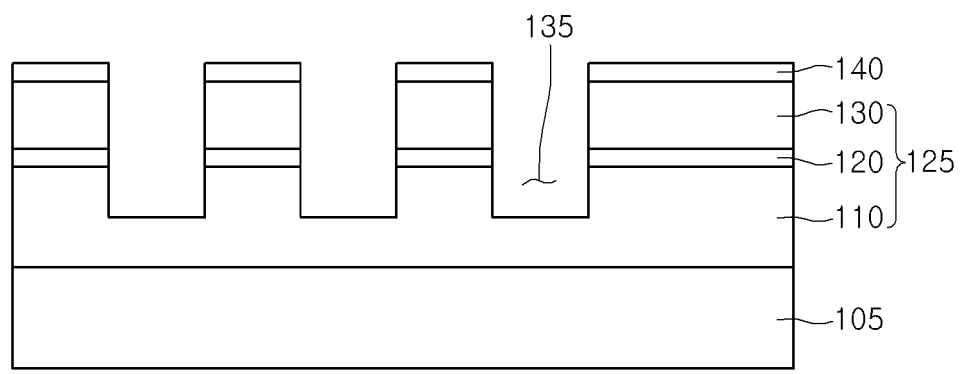

Referring to FIG. 4, a second conductive layer 140 may be formed on the second conductive type semiconductor layer 130. The second conductive layer 140 may be formed on the second conductive type semiconductor layer 130 which is not etched in the recess formation process. The second conductive layer 140 may be formed of at least one of Al, Ti, Cr, Ni, Cu, and Au.

Figure 5:
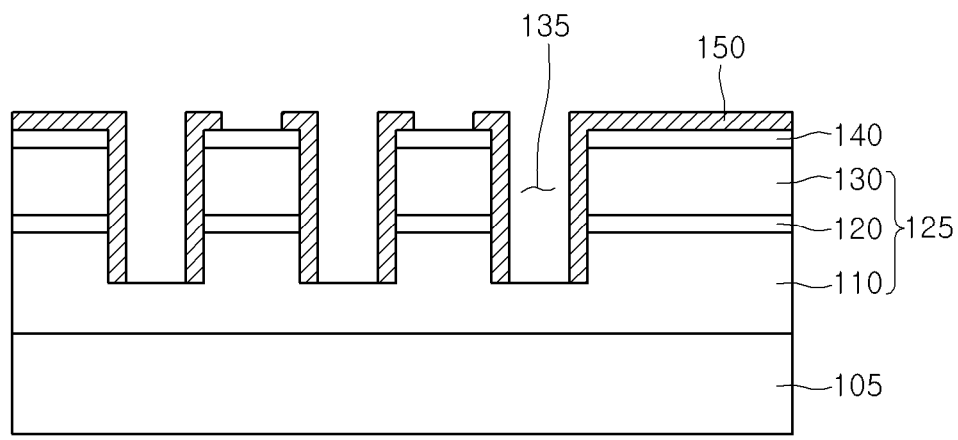

Referring to FIG. 5, an insulation layer 150 may be formed on the side surface of the recess 135, a portion of the bottom surface of the recess 135, and a portion of the second conductive layer 140. The insulation layer 150 may prevent the light emitting structure layer 125 from being electrically connected to the first conductive layer 170 that will be formed later. For example, the insulation layer 150 may be formed of at least one of $SiO_2$, $Si_xN_y$, $TiO_2$, $MgF_2$, and $Al_2O_3$.

The insulation layer 150 may be formed using one of deposition processes such as E-beam deposition process, a sputtering process, and a plasma enhanced chemical vapor deposition (PECVD) process, but is not limited thereto.

For example, the deposition process may be performed after a mask is formed on the recess 135. Thus, the insulation layer 150 may have a shape varied according to a shape of the mask.

Figure 6:
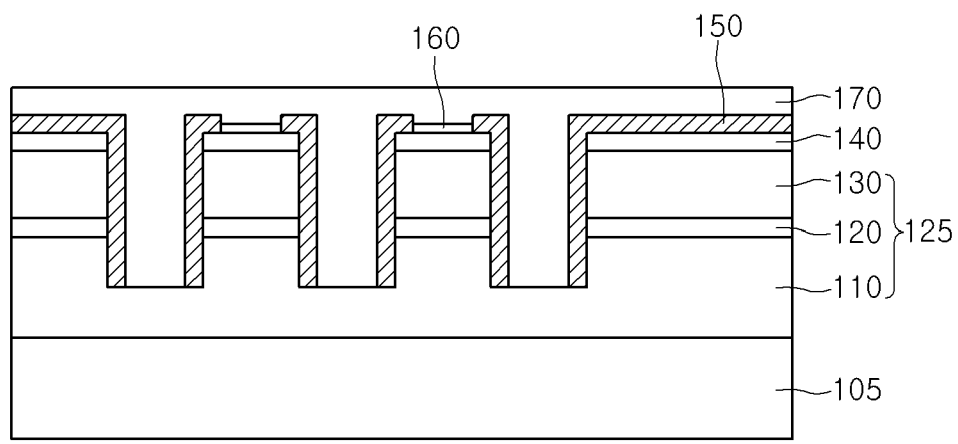

Referring to FIG. 6, a tunnel barrier 160 may be formed on the second conductive layer 140 on which the insulation layer 150 is not formed. The tunnel barrier 160 may be formed of the same material as that of the insulation layer 150 or a material different from that of the insulation layer 150. Also, the tunnel barrier 160 may have a thickness less than that of the insulation layer 150. The tunnel barrier 160 may be formed of a dielectric compound comprising at least one of materials comprising oxide, nitride, and fluoride. For example, the tunnel barrier 160 may be formed of at least one of $SiO_2$, $Si_xN_y$, $TiO_2$, $MgF_2$, and $Al_2O_3$, and have a single or multi layered structure. The tunnel barrier 160 may have a thickness less than that of the insulation layer 150. For example, the tunnel barrier 160 may have a thickness of about 1 nm to about 20 nm. When the tunnel barrier 160 has a thickness less than that of the insulation layer 150, thermal dissipation efficiency may be improved. Accordingly, reliability of the device can be improved.

At least one tunnel barrier 160 may be formed in the light emitting device 100. Here, the tunnel barrier 160 may be deposited using one of chemical vapor deposition, physical vapor deposition, atomic layer deposition (ALD).

When a current is applied at a predetermined voltage or less, the tunnel barrier 160 may serve as a nonconductor. When a current is applied at a voltage greater than the predetermined voltage under an electrostatic discharge (ESD) condition, the tunnel barrier 160 may provide a tunnel phenomenon. That is, when compared to a P-N junction structure, a relatively low resistance may occur due to the tunnel phenomenon. Thus, a current may flow into the tunnel barrier 160 under the ESD condition. A tunneling effect at which the tunnel phenomenon occurs in the tunnel barrier 160 may be inversely proportional to a thickness of the tunnel barrier 160.

Next, a first conductive layer 170 may be formed. The first conductive layer 170 may contact the first conductive type semiconductor layer 110 exposed by the recess 135 and cover the insulation layer 150 and the tunnel barrier 160. The first conductive layer 170 may contact a top surface of the tunnel barrier 160 and be formed of at least one of Al, Ti, Cr, Ni, Cu, Au, Sn, and Ca.

Also, the first conductive layer 170 may have a multi layered structure. For example, a first layer constituting a lower region of the first conductive layer 170 may be formed of a material for ohmic-contacting the first conductive type semiconductor layer 110 and thus electrically connected to the first conductive type semiconductor layer 110. A third layer constituting an upper region of the first conductive layer 170 may be formed of a material having a superior adhesion force to easily adhere to an external electrode. A second layer between the first layer and the third layer may be formed of at least one of a diffusion barrier metal material such as Ni for preventing interlayer diffusion and a metal material such as Cu having superior conductivity.

Figure 7:
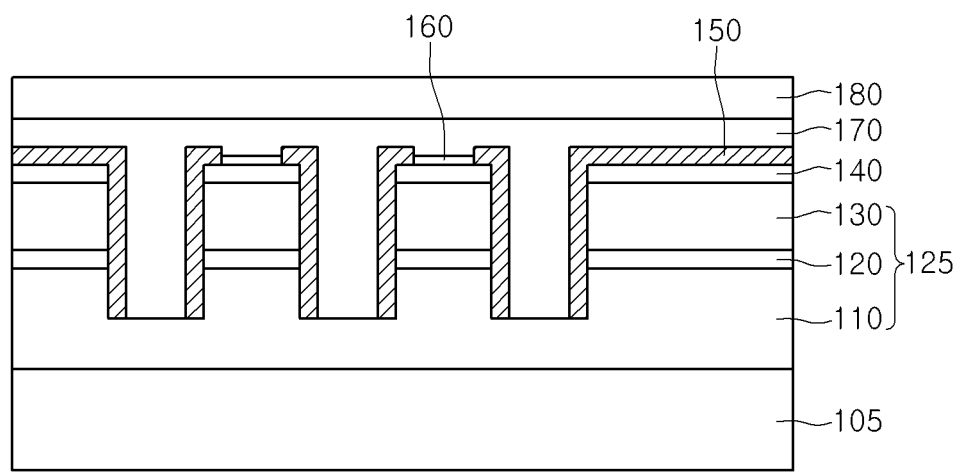

Referring to FIG. 7, a conductive support substrate 180 may be formed on the first conductive layer 170. The conductive support substrate 180 may support the light emitting structure layer 125 and supply a power to the light emitting structure layer 125. The conductive support substrate 180 may be formed of titanium (Ti), chrome (Cr), nickel (Ni), aluminum (Al), platinum (Pt), gold (Au), tungsten (W), copper (Cu), molybdenum (Mo), copper-tungsten (Cu—W), and a carrier wafer (e.g., Si, Ge, GaN, GaAs, ZnO, SiC, SiGe) that is a semiconductor substrate in which impurities are injected.

The conductive support substrate 180 may have a thickness varied according to a design of the light emitting device 100. For example, the conductive support substrate 180 may have a thickness of about 50 µm to about 300 µm.

Figure 8:
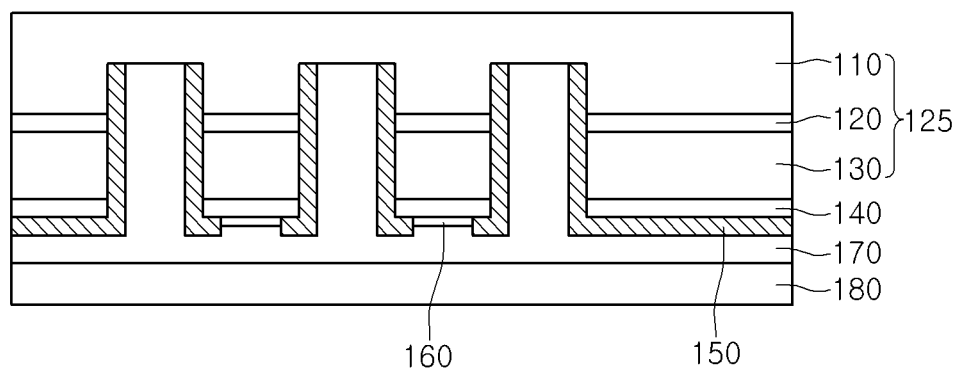

Referring to FIGS. 7 and 8, the growth substrate 105 may be removed.

The growth substrate 105 may be removed through a laser lift off (LLO) process, chemical lift off (CLO) process or a physical polishing process, but is not limited thereto.

Also, to improve reliability of the fabricating process, the growth substrate 105 may be removed after the first conductive layer 170 is formed. However, the present disclosure is not limited to an order of the manufacturing process.

Also, after the growth substrate 105 is removed, remnants existing on the exposed light emitting structure layer 125 may be removed. Then, an etching process for forming a roughness or pattern may be performed to improve light extraction efficiency.

Figure 9:
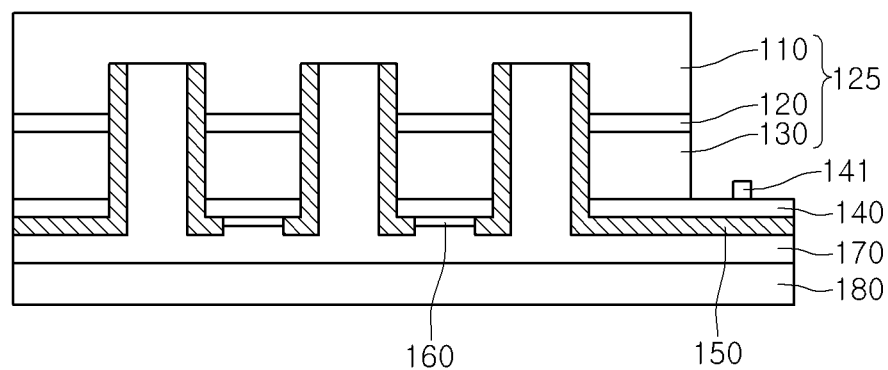

Referring to FIG. 9, the light emitting structure layer 125 may be etched to expose a portion of the second conductive layer 140. An electrode 141 may be formed on the second conductive layer 140 exposed by the etching process. The electrode 141 may be an electrode pad or have an electrode pattern including the electrode pad. The electrode pattern may have a branched structure.

The electrode 141 may be formed of at least one material of Ti, Al, In, Ta, Pd, Co, Ni, Si, Ge, Ag, Au, Hf, Pt, Ru, and Au or alloys thereof and have a single or multi layer structure. The electrode 141 may be formed on the second conductive layer 140 to supply a power into the second conductive type semiconductor layer 130.

Embodiments also may provide a light emitting device in which a light emitting structure layer 125 is protected from an electrostatic discharge (ESD) using the tunnel barrier 160 connected to the light emitting structure layer 125 in parallel, a method of fabricating the light emitting device.

Figure 10:
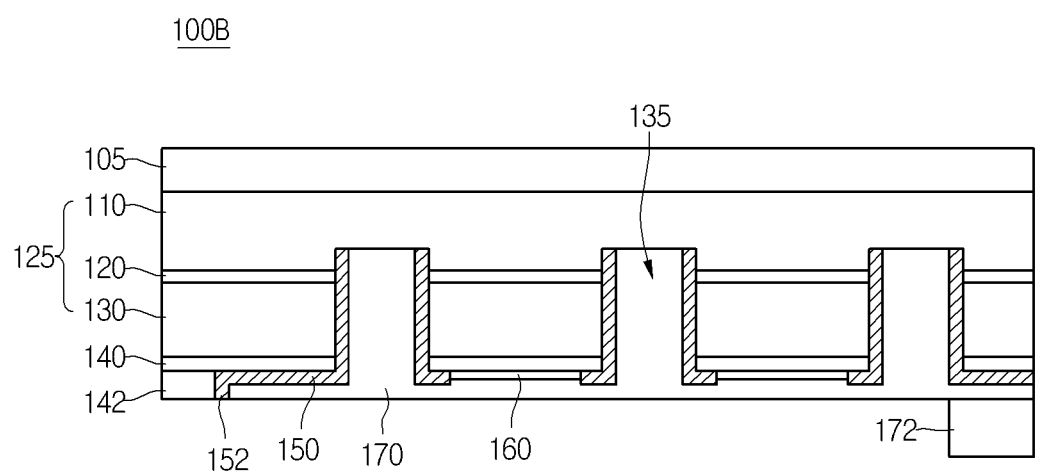
FIG. 10 is a sectional view of a light emitting device according to another embodiment.

FIG. 10 is a sectional view of a light emitting device according to another embodiment.

Referring to FIG. 10, a light emitting device 100B according to another embodiment may comprise a light emitting structure layer 125, a first conductive layer 170, a second conductive layer 140, an insulation layer 150, a tunnel barrier 160, a first electrode 172, and a second electrode 142. A growth substrate 105 may be further disposed on the light emitting structure layer 125. Alternatively, the growth substrate 105 may be omitted.

The light emitting structure layer 125 may comprise a first conductive type semiconductor layer 110, a second conductive type semiconductor layer 130, and an active layer 120 dispose between the first conductive type semiconductor layer 110 and the second conductive type semiconductor layer 130.

The first conductive layer 170 may pass through the active layer 120 and the second conductive type semiconductor layer 130 to contact the first conductive type semiconductor layer 110. The first conductive layer 170 may be electrically connected to the first conductive type semiconductor layer 110.

The second conductive layer 140 may be disposed under the second conductive type semiconductor layer 130. The second conductive layer 140 may be electrically connected to the second conductive type semiconductor layer 130.

The insulation layer 150 may be disposed between the first conductive layer 170 and the second conductive layer 140. The insulation layer 150 may be disposed between the first conductive layer 170 and the second conductive type semiconductor layer 130. Also, the insulation layer 150 may be disposed between the first conductive layer 170 and the active layer 120. The insulation pattern 150 may comprise a protrusion 152.

The tunnel barrier 160 may be disposed between the first conductive layer 170 and the second conductive layer 140. The tunnel barrier 160 may be disposed under the second conductive type semiconductor layer 130.

The first electrode 172 may be electrically connected to the first conductive layer 170. The first electrode 172 may be disposed under the first conductive layer 170. The second electrode 142 may be electrically connected to the second conductive layer 140. The second electrode 142 may be disposed under the second conductive layer 140. The second electrode 142 and the first conductive layer 170 may be insulated from each other by the insulation layer 150.

Each of the first electrode 172 and the second electrode 142 may be formed of at least one material of Ti, Al, In, Ta, Pd, Co, Ni, Si, Ge, Ag, Au, Hf, Pt, Ru, and Au or alloys thereof and have a single or multi layer structure. The first and second electrodes 172 and 142 may supply a power into the first and second conductive type semiconductor layers 110 and 130, respectively.

Figure 11:
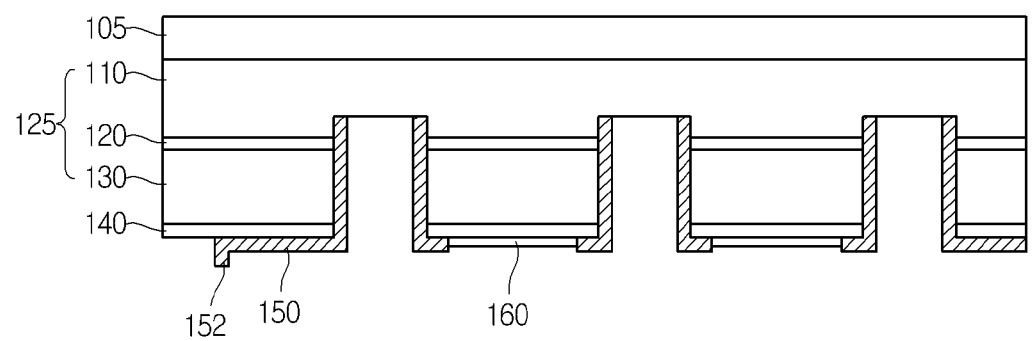
FIG. 11 is a view illustrating a process of fabricating the light emitting device according to another embodiment.

FIG. 11 is a view illustrating a process of fabricating the light emitting device according to another embodiment.

Referring to FIGS. 2 and 4, a process of forming the second conductive layer 140 on the second conductive type semiconductor layer 130 may be similarly applied.

Thereafter, the insulation layer 150 may be formed on a side surface of the light emitting structure layer 125 having the recess 135 and a portion of the second conductive layer 140. The insulation layer 150 formed on a portion of the second conductive layer 140 may expose a portion of the second conductive layer 140. The insulation pattern 150 may comprise a protrusion 152.

For example, the insulation layer 150 may be formed after a mask is formed on the recess 135. Thus, the insulation layer 150 may have a shape varied according to a shape of the mask.

The tunnel barrier 160 may be formed on a portion of the second conductive layer 140 on which the insulation layer 150 is not formed. The tunnel barrier 160 may be formed of the same material as that of the insulation layer 150 or a material different from that of the insulation layer 150.

The first conductive layer 170 contacting the first conductive type semiconductor layer 110 exposed by the recess 135 and covering the insulation layer 150 and the tunnel barrier 160 may be formed. The first conductive layer 170 may fill the recess 135 and have a height equal to that of the protrusion 152 of the insulation layer 150.

The first electrode 172 and the second electrode 142 may be electrically connected to the first conductive layer 170 and the second conductive layer 140, respectively. Each of the first electrode 172 and the second electrode 142 may be formed of at least one material of Ti, Al, In, Ta, Pd, Co, Ni, Si, Ge, Ag, Au, Hf, Pt, Ru, and Au or alloys thereof and have a single or multi layer structure.

A top surface of the second electrode 142 may be flush with that of the first conductive layer 170. Alternatively, the first electrode 172 may be omitted. The light emitting device may have a flip-chip structure to improve the light extraction efficiency, realize miniaturization, and reduce thermal resistance.

Figure 12:
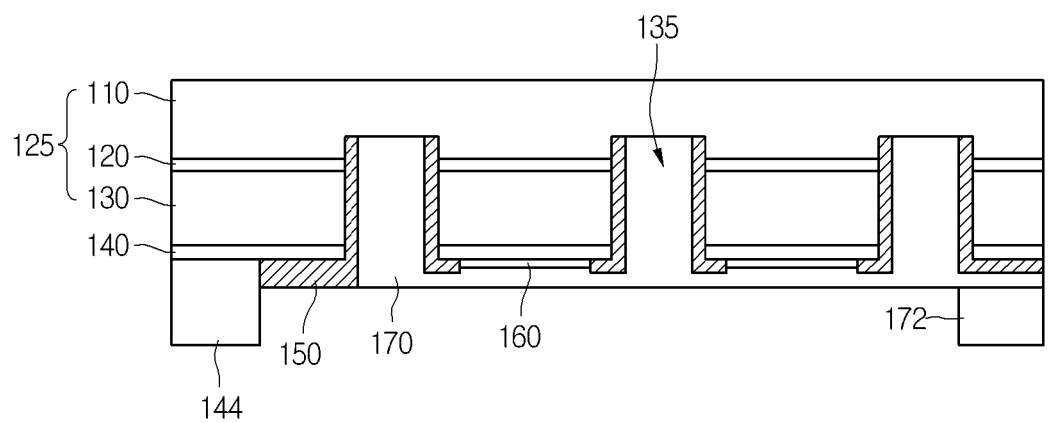
FIG. 12 is a sectional view of a light emitting device according to another embodiment.

FIG. 12 is a sectional view of a light emitting device according to another embodiment.

Referring to FIG. 12, a light emitting device 100C according to another embodiment may comprise a light emitting structure layer 125, a first conductive layer 170, a second conductive layer 140, an insulation layer 150, a tunnel barrier 160, a first electrode 172, and a second electrode 144.

The light emitting structure layer 125 may comprise a first conductive type semiconductor layer 110, a second conductive type semiconductor layer 130, and an active layer 120 dispose between the first conductive type semiconductor layer 110 and the second conductive type semiconductor layer 130.

The first conductive layer 170 may pass through the active layer 120 and the second conductive type semiconductor layer 130 to contact the first conductive type semiconductor layer 110. The first conductive layer 170 may be electrically connected to the first conductive type semiconductor layer 110.

The second conductive layer 140 may be disposed under the second conductive type semiconductor layer 130. The second conductive layer 140 may be electrically connected to the second conductive type semiconductor layer 130.

The insulation layer 150 may be disposed between the first conductive layer 170 and the second conductive layer 140. The insulation layer 150 may be disposed between the first conductive layer 170 and the second conductive type semiconductor layer 130. Also, the insulation layer 150 may be disposed between the first conductive layer 170 and the active layer 120.

The tunnel barrier 160 may be disposed between the first conductive layer 170 and the second conductive layer 140. The tunnel barrier 160 may be disposed under the second conductive type semiconductor layer 130.

The first electrode 172 may be electrically connected to the first conductive layer 170. The first electrode 172 may be disposed under the first conductive layer 170. The first electrode 144 may be electrically connected to the first conductive layer 140. The second electrode 144 may be disposed under the second conductive layer 140. The second electrode 144 and the first conductive layer 170 may be insulated from each other by the insulation layer 150.

Each of the first electrode 172 and the second electrode 144 may be formed of at least one material of Ti, Al, In, Ta, Pd, Co, Ni, Si, Ge, Ag, Au, Hf, Pt, Ru, and Au or alloys thereof and have a single or multi layer structure. The first and second electrodes 172 and 144 may supply a power into the first and second conductive type semiconductor layers 110 and 130, respectively.

The first electrode 172 may be disposed under the first conductive layer 144. The first electrode 172 and the second electrode 144 may be connected to an external power source in a flip-chip bonding type.

The insulation layer 150, the first electrode 172, and the second electrode 144 may be disposed at various positions according to their design. Also, the layer 150, the first electrode 172, and the second electrode 144 may be variously varied in formation method and order according to their design.

Figure 13:
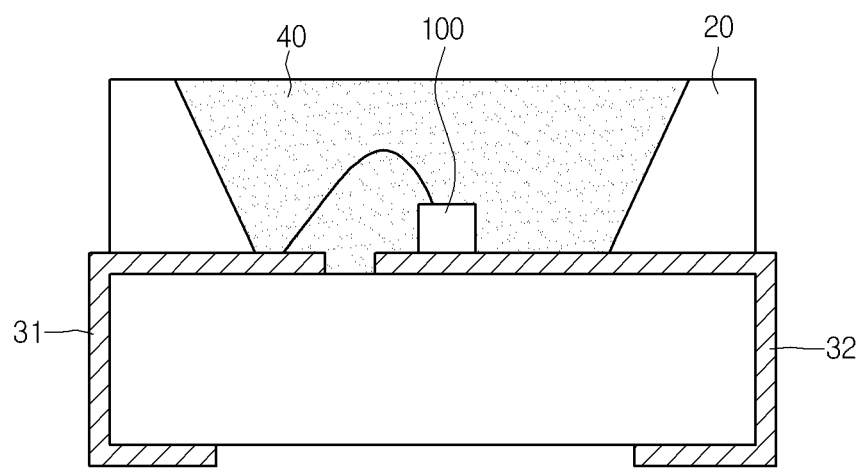
FIG. 13 is a sectional view of a light emitting device package comprising the light emitting device according to an embodiment.

FIG. 13 is a sectional view of a light emitting device package comprising the light emitting device according to an embodiment.

Referring to FIG. 13, the light emitting device package according to an embodiment may comprise a body 20, a first electrode 31 and a second electrode 32, which are disposed on the body 20, the light emitting device 100 disposed on the body 20 and electrically connected to the first electrode 31 and the second electrode 32, and a molding member 40 surrounding the light emitting device 100.

The body 20 may be formed of a silicon material, a synthetic resin material, or a metal material. An inclined surface may be disposed around the light emitting device 100.

The first electrode 31 and the second electrode 32 are electrically separated from each other and supply a power to the light emitting device 100. Also, the first electrode 31 and the second electrode 32 may reflect light generated in the light emitting device 100 to improve light efficiency, and may dissipate heat generated in the light emitting device 100 to the outside.

The light emitting device 100 may be disposed on the body 20 or on the first electrode 31 or the second electrode 32.

The light emitting device 100 may be electrically connected to the first and second electrodes 31 and 32 through a wiring process, a flip-chip process, or a die bonding process.

The molding member 40 may surround the light emitting device 100 to protect the light emitting device 100. The molding member 40 may comprise a phosphor to vary a wavelength of light emitted form the light emitting device 100.

The above-described light emitting device according to the embodiment may be applied to a light unit. The light unit may comprise a structure in which a plurality of light emitting devices is arrayed. The light unit may be applied to the display device of FIGS. 13 and 14 and a lighting device of FIG. 15. Also, the light unit to which the light emitting device according to the embodiment is applied may be applied to illumination lamps, traffic lights, vehicle headlights, signs, and televisions.

Figure 14:
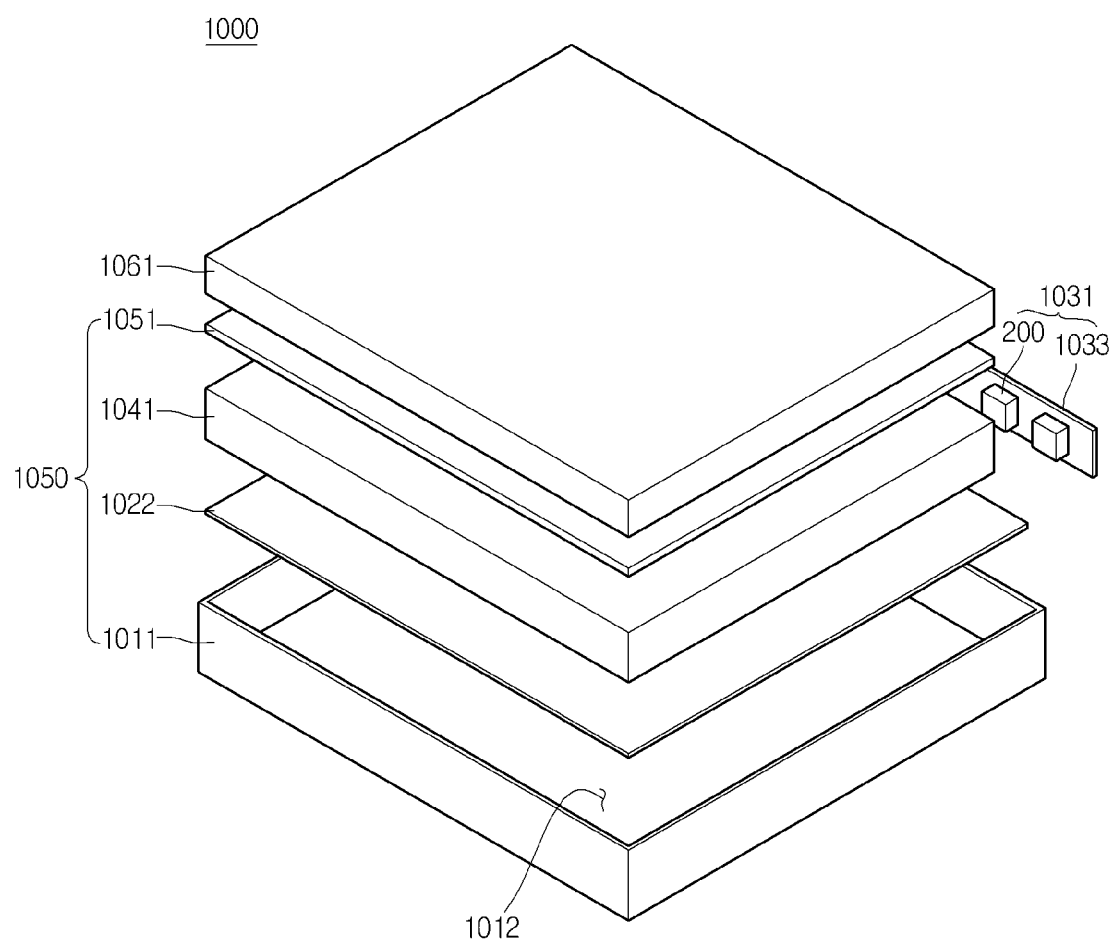
FIG. 14 is a perspective view illustrating an example of a display device according to an embodiment.

FIG. 14 is an exploded perspective view illustrating a display device according to an embodiment.

Referring to FIG. 14, a display unit 1000 may comprise a light guide plate 1041, a light emitting module 1031 providing light to the light guide plate 1041, a reflective member 1022 under the light guide plate 1041, an optical sheet 1051 on the light guide plate 1041, a display panel 1061 on the optical sheet 1051, and a bottom cover 1011 receiving the light guide plate 1031, the light emitting module 1031, and the reflective member 1022, but is not limited thereto.

The bottom cover 1011, the reflective member 1022, the light guide plate 1041, and the optical sheet 1051 may be defined as the light unit 1050 of the display device.

The light guide plate 1041 diffuses light to produce planar light. The light guide plate 1041 may be formed of a transparent material. For example, the light guide plate 1041 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1031 is disposed to provide light to the at least one lateral surface of the light guide plate 1041. Thus, the light emitting module 1031 may be used as a light source of a display device.

At least one light emitting module 1031 may be disposed on one lateral surface of the light guide plate 1041 to directly or indirectly provide light. The light emitting module 1031 may comprise a board 1033 and the light emitting device 200 according to the embodiment. The light emitting device 200 may be arrayed by a predetermined distance on the board 1033.

The board 1033 may be a printed circuit board (PCB) comprising a circuit pattern. The board 1033 may comprise a metal core PCB (MCPCB) or a flexible PCB (FPCB) as well as a general PCB, but is not limited thereto. When the light emitting device 200 are mounted on a lateral surface of the bottom cover 1011 or on a heatsink plate, the board 1033 may be removed. Here, a portion of the heatsink plate may contact a top surface of the bottom cover 1011.

The plurality of light emitting device 200 may be mounted on the board 1033 to allow a light emitting surface through which light is emitted to be spaced a predetermined distance from the light guide plate 1041, but is not limited thereto. The light emitting device 200 may directly or indirectly provide light to a light incident surface that is a side surface of the light guide plate 1041, but is not limited thereto.

The reflective member 1022 may be disposed below the light guide plate 1041. Since the reflective member 1022 reflects light incident onto an under surface of the light guide plate 1041 to supply the light upward, brightness of the light unit 1050 may be improved. For example, the reflective member 1022 may be formed of one of PET, PC, and PVC, but is not limited thereto. The reflective member 1022 may be the top surface of the bottom cover 1011, but is not limited thereto.

The bottom cover 1011 may receive the light guide plate 1041, the light emitting module 1031, and the reflective member 1022. For this, the bottom cover 1011 may comprise a receiving part 1012 having a box shape with an opened upper side, but is not limited thereto. The bottom cover 1011 may be coupled to a top cover (not shown), but is not limited thereto.

The bottom cover 1011 may be formed of a metal material or a resin material. Also, the bottom cover 1011 may be manufactured using a press molding process or an extrusion molding process. The bottom cover 1011 may be formed of a metal or non-metal material having superior heat conductivity, but is not limited thereto.

For example, the display panel 1061 may be a liquid crystal display (LCD) panel, and comprise first and second boards formed of a transparent material and a liquid crystal layer between the first and second boards. A polarizing plate may be attached to at least one surface of the display panel 1061. The present disclosure is not limited to the attached structure of the polarizing plate. The display panel 1061 may display information using light emitted from the light emitting module 1051. The display unit 1000 may be applied to various portable terminals, a monitor for a notebook computer, a monitor for a laptop computer, television, etc.

The optical sheet 1051 is disposed between the display panel 1061 and the light guide plate 1041 and comprises at least one transmission sheet. For example, the optical sheet 1051 may comprise at least one of a diffusion sheet, a horizontal or vertical prism sheet, a brightness enhanced sheet, etc. The diffusion sheet diffuses incident light, and the horizontal or/and vertical prism sheet collects the incident light into a display region. In addition, the brightness enhanced sheet reuses lost light to improve the brightness. Also, a protection sheet may be disposed on the display panel 1061, but is not limited thereto.

Here, optical members such as the light guide plate 1041 and the optical sheet 1051 may be disposed on an optical path of the light emitting module 1031, but is not limited thereto.

Figure 15:
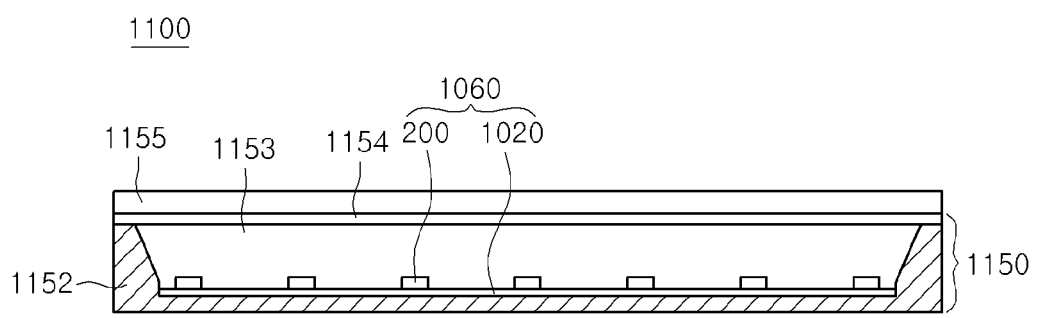
FIG. 15 is a perspective view illustrating another example of a display device according to an embodiment.

FIG. 15 is a view of a display device according to an embodiment.

Referring to FIG. 15, a display apparatus 1100 may comprise a bottom cover 1152, a board 1020 on which the light emitting devices 200 described above are arrayed, an optical member 1154, and a display panel 1155.

The board 1020 and the light emitting device 200 may be defined as a light emitting module 1060. The bottom cover 1152, at least one light emitting module 1060, the optical member 1154 may be defined as the light unit.

The bottom cover 1152 may comprise a receiving part 1153, but is not limited thereto.

Here, the optical member 1154 may comprise at least one of a lens, a light guide plate, a diffusion sheet, horizontal and vertical prism sheets, and a bright enhancement sheet. The light guide plate may be formed of a PC material or PMMA material. In this case, the light guide plate may be removed. The diffusion sheet diffuses incident light, and the horizontal and vertical prism sheets collect the incident light into the display panel 1155. The brightness enhanced sheet reuses lost light to improve brightness.

The optical member 1154 is disposed on the light emitting module 1060 to produce planar light using the light emitted from the light emitting module 1060 or diffuse and collect the light emitted from the light emitting module 1060.

Figure 16:
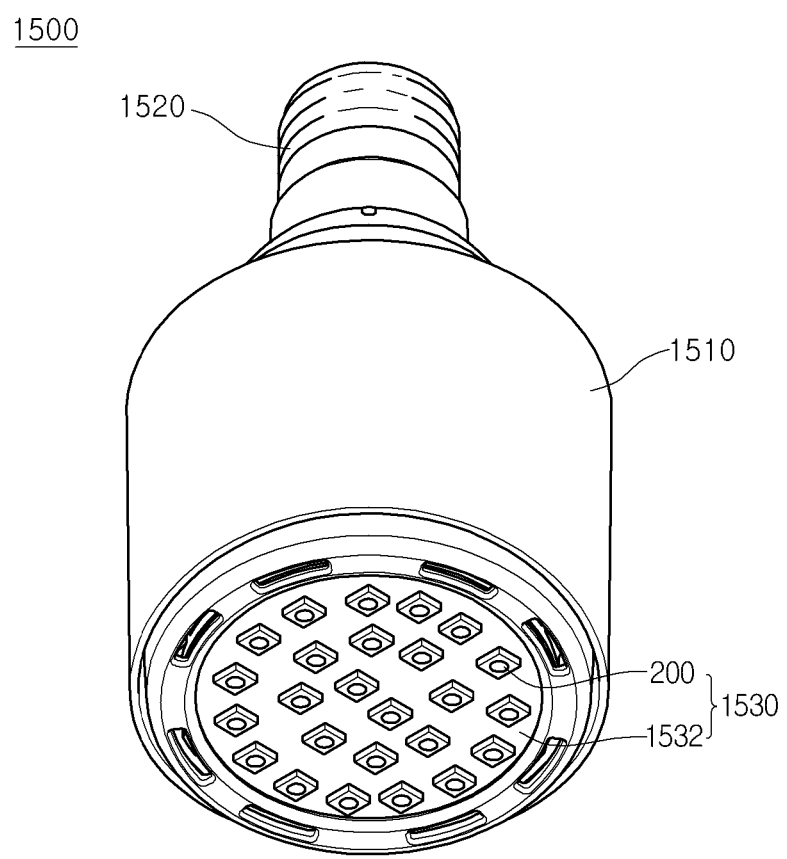
FIG. 16 is a perspective view of a light device according to an embodiment.

FIG. 16 is a perspective view of a lighting device according to an embodiment.

Referring to FIG. 16, the lighting unit 1500 may comprise a case 1510, a light emitting module 1530 disposed in the case 1510, and a connection terminal 1520 disposed in the case 1510 to receive an electric power from an external power source.

The case body 1510 may be formed of a material having good thermal dissipation properties, e.g., a metal material or a resin material.

The light emitting module 1530 may comprise a board 1532 and a light emitting device 200 mounted on the board 1532. The light emitting device 200 may be provided in plurality, and the plurality of light emitting device 200 may be arrayed in a matrix shape or spaced a predetermined distance from each other.

The board 1532 may be an insulator on which a circuit pattern is printed. For example, the board 1532 may comprise a general printed circuit board (PCB), a metal core PCB, a flexible PCB, a ceramic PCB, FR-4, etc.

Also, the board 1532 may be formed of a material which may effectively reflect light or be coated with a color by which light is effectively reflected, e.g., a white color or a silver color.

At least one light emitting device 200 may be disposed on the board 1532. The light emitting device 200 may comprise at least one light emitting diode (LED) chip. The LED may include color LEDs, which respectively emit light having a red color, a green color, a blue color, and a white color and an ultraviolet (UV) LED emitting UV rays.

The light emitting module 1530 may have a combination of several light emitting devices 200 to obtain desired color and luminance. For example, the white LED, the red LED, and the green LED may be combined with each other to secure a high color rendering index to obtain a high color rendering index (CRI).

The connection terminal 1520 may be electrically connected to the light emitting module 1530 to supply a power. The connection terminal 1520 may be screwed and coupled to an external power source in a socket type, but is not limited thereto. For example, the connection terminal 1520 may have a pin shape, and thus, be inserted into the external power source. Alternatively, the connection terminal 1220 may be connected to the external power source by a wire.

In the above-described lighting device, at least one of the light guide member, the spread sheet, the light collecting sheet, the brightness enhancement sheet, and the fluorescent sheet is disposed in the path of light emitted from the light emitting module to obtain an intended optical effect.

Embodiments provide a light emitting device having a new structure, a method of fabricating the light emitting device, and a light unit.

Embodiments also provide a light emitting device in which a light emitting structure layer is protected from the electrostatic discharge (ESD), a method of fabricating the light emitting device, and a light unit.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure layer comprising a first conductive type semiconductor layer, an active layer under the first conductive type semiconductor layer, and a second conductive type semiconductor layer under the active layer;
   a first conductive layer having a first portion disposed under the second conductive type semiconductor layer and a second portion electrically connected to the first conductive type semiconductor layer;
   a second conductive layer under the second conductive type semiconductor layer and electrically connected to the second conductive type semiconductor layer;
   an insulation layer between the first conductive layer and the second conductive layer; and
   a tunnel barrier between the first portion of the first conductive layer and the second conductive layer.

2. The light emitting device according to claim 1, wherein the tunnel barrier has a thickness less than that of the insulation layer.

3. The light emitting device according to claim 1, wherein the tunnel barrier is formed of the same material as that of the insulation layer or a material different from that of the insulation layer.

4. The light emitting device according to claim 1, wherein the tunnel barrier is formed of at least one of nitride, oxide, and fluoride.

5. The light emitting device according to claim 1, wherein the tunnel barrier has a thickness of about 1 nm to about 20 nm.

6. The light emitting device according to claim 1, wherein the tunnel barrier is formed of at least one of $Al_2O_3$, $SiO_2$, $SiN_x$, $TiO_2$, $MgF_2$.

7. The light emitting device according to claim 1, wherein the second portion of the first conductive layer is disposed in a recess passing through a portion of the second conductive type semiconductor layer and a portion of the active layer to contact the first conductive type semiconductor layer.

8. The light emitting device according to claim 7, wherein the insulation layer is disposed within the recess to insulate the first conductive layer from the second conductive type semiconductor layer.

9. The light emitting device according to claim 1, further comprising an electrode electrically connected to the second conductive layer.

10. The light emitting device according to claim 9, wherein the electrode is formed of at least one of Ti, Al, In, Ta, Pd, Co, Ni, Si, Ge, Ag, Au, Hf, Pt, Ru, and Au.

11. The light emitting device according to claim 9, wherein the electrode is disposed on the second conductive layer.

12. The light emitting device according to claim 9, wherein the electrode is disposed under the second conductive layer.

13. The light emitting device according to claim 1, further comprising a conductive support substrate under the first conductive layer.

14. The light emitting device according to claim 1, wherein the second conductive layer is disposed between the second conductive type semiconductor layer and the tunnel barrier.

15. A light unit comprising:
    a board;
    a light emitting device on the board; and
    an optical member through which light provide from the light emitting device is transmitted,
    wherein the light emitting device comprises:
    a light emitting structure layer comprising a first conductive type semiconductor layer, an active layer under the first conductive type semiconductor layer, and a second conductive type semiconductor layer under the active layer;
    a first conductive layer having a first portion disposed under the second conductive type semiconductor layer and a second portion electrically connected to the first conductive type semiconductor layer;
    a second conductive layer under the second conductive type semiconductor layer and electrically connected to the second conductive type semiconductor layer;
    an insulation layer between the first conductive layer and the second conductive layer; and
    a tunnel barrier between the first portion of the first conductive layer and the second conductive layer.

16. The light unit according to claim 15, wherein the tunnel barrier has a thickness less than that of the insulation layer.

17. The light unit according to claim 15, wherein the tunnel barrier is formed of the same material as that of the insulation layer or a material different from that of the insulation layer.

18. The light unit according to claim 15, wherein the tunnel barrier is formed of at least one of nitride, oxide, and fluoride.

19. The light unit according to claim 15, wherein the tunnel barrier is formed of at least one of $Al_2O_3$, $SiO_2$, $SiN_x$, $TiO_2$, $MgF_2$.

20. The light unit according to claim 15, wherein the second portion of the first conductive layer is disposed in a recess passing through a portion of the second conductive type semiconductor layer and a portion of the active layer to contact the first conductive type semiconductor layer.

\* \* \* \* \*